(12) United States Patent
Hammer

(10) Patent No.: US 9,103,850 B2
(45) Date of Patent: *Aug. 11, 2015

(54) MICROMECHANICAL SENSOR WITH MULTIPLE SPRING BARS

(75) Inventor: Hanno Hammer, Graz-Lebring (AT)

(73) Assignee: Maxim Integrated Products, Inc., San Jose, CA (US)

( * ) Notice: Subject to any disclaimer, the term of this patent is extended or adjusted under 35 U.S.C. 154(b) by 234 days.

This patent is subject to a terminal disclaimer.

(21) Appl. No.: 13/266,985

(22) PCT Filed: Apr. 27, 2010

(86) PCT No.: PCT/EP2010/055635
§ 371 (c)(1),
(2), (4) Date: Oct. 28, 2011

(87) PCT Pub. No.: WO2010/125071
PCT Pub. Date: Nov. 4, 2010

(65) Prior Publication Data
US 2012/0042728 A1    Feb. 23, 2012

(30) Foreign Application Priority Data
Apr. 28, 2009   (DE) .......................... 10 2009 002 701

(51) Int. Cl.
*G01P 15/08*    (2006.01)
*G01C 19/56*    (2012.01)
(Continued)

(52) U.S. Cl.
CPC ................ *G01P 15/08* (2013.01); *B81B 3/007* (2013.01); *G01C 19/5712* (2013.01); *B81B 2201/0235* (2013.01); *B81B 2203/0118* (2013.01); *B81B 2203/056* (2013.01); *G01P 2015/0817* (2013.01)

(58) Field of Classification Search
USPC .............. 73/504.12, 504.14, 504.04, 514.38, 73/514.36
See application file for complete search history.

(56) References Cited

U.S. PATENT DOCUMENTS 6,393,913 B1 *   5/2002   Dyck et al. ................. 73/504.12
6,401,536 B1 *   6/2002   O'Brien ..................... 73/514.38
(Continued)

FOREIGN PATENT DOCUMENTS

DE    10238893 A1    3/2004
EP     2184583 A1    5/2010
(Continued)

OTHER PUBLICATIONS

International Search Report for Co-Pending PCT Application No. PCT/EP2010/055635, Sep. 2010.
(Continued)

*Primary Examiner* — Helen Kwok
(74) *Attorney, Agent, or Firm* — North Weber & Baugh LLP

(57) ABSTRACT

A micromechanical sensor comprising a substrate (5) and at least one mass (6) which is situated on the substrate (5) and which moves relative to the substrate (5) is used to detect motions of the sensor based on an acceleration force and/or Coriolis force which occur(s). The mass (6) and the substrate (5) and/or two masses which move toward one another are connected by at least one bending spring device (1) for a relative rotational motion. The bending spring device (1) has multiple, in particular two, spring bars (2) extending essentially parallel to one another for improving the linear spring characteristic of the bending spring device during the rotational motion, and at least one meander (3) on at least one, preferably on all, of the spring bars (2).

20 Claims, 7 Drawing Sheets

(51) Int. Cl.
   *B81B 3/00*      (2006.01)
   *G01C 19/5712*   (2012.01)

(56) References Cited

U.S. PATENT DOCUMENTS

| | | | |
|---|---|---|---|
| 6,536,282 B1* | 3/2003 | Kipp et al. | 73/514.38 |
| 6,546,801 B2* | 4/2003 | Orsier et al. | 73/514.38 |
| 6,705,164 B2 | 3/2004 | Willig et al. | |
| 6,752,017 B2* | 6/2004 | Willig et al. | 73/504.04 |
| 6,823,733 B2* | 11/2004 | Ichinose | 73/504.02 |
| 7,284,429 B2* | 10/2007 | Chaumet et al. | 73/504.12 |
| 8,261,614 B2* | 9/2012 | Hartmann et al. | 73/504.12 |
| 8,342,022 B2* | 1/2013 | Schmid et al. | 73/504.12 |
| 8,353,212 B2* | 1/2013 | Hammer | 73/504.12 |
| 8,443,668 B2* | 5/2013 | Ohms et al. | 73/504.12 |
| 8,549,919 B2* | 10/2013 | Gunthner et al. | 73/504.14 |
| 2012/0048018 A1* | 3/2012 | Hammer | 73/504.12 |

FOREIGN PATENT DOCUMENTS

| | | |
|---|---|---|
| WO | 2009016240 A1 | 2/2009 |
| WO | 2009062786 A1 | 5/2009 |

OTHER PUBLICATIONS

English translation of Written Opinion of Sep. 29, 2010, from priority International Application No. PCT/EP2010/055635, filed Apr. 27, 2010.

English translation of International Preliminary Report on Patentabiliity of Nov. 11, 2011, from priority International Application No. PCT/EP2010/055635, filed Apr. 27, 2010.

Office Action dated May 22, 2013, in corresponding Chinese Patent Application No. 2010900189507.

* cited by examiner

MICROMECHANICAL SENSOR WITH MULTIPLE SPRING BARS

CROSS REFERENCE TO RELATED PATENT APPLICATIONS

This application is the National Phase Application under 35 USC§371 of International Application No. PCT/EP2010/055635, filed Apr. 27, 2010, which claims priority to German Patent Application 10 2009 002 701.7, filed Apr. 28, 2009.

BACKGROUND

A. Technical Field

The present invention relates to a micromechanical sensor comprising a substrate and at least one mass which is situated on the substrate and which moves relative to the substrate for detecting motions of the sensor based on an acceleration force and/or Coriolis force which occur(s), the mass and the substrate and/or two masses which move toward one another being connected by at least one bending spring device for a relative rotational motion.

B. Background of the Invention

Micromechanical sensors are used for detecting accelerations and/or yaw rates along a spatial axis or at least one of three mutually orthogonal spatial axes. The operating principle is basically that a sensor mass is moved relative to a substrate as a response to the corresponding acceleration or yaw rate of the sensor. For this purpose, the sensor mass is movably mounted on the substrate by means of a bending spring device, which is generally composed of one or more bending springs. The design of these bending springs primarily determines the particular directions in which the sensor mass is movable. The spring stiffnesses of the bending springs are different in the individual spatial directions in order to more or less permit different bending directions. This difference in movability may be influenced by varying the cross-sectional surface area of the bending spring, and also by virtue of the spatial course of the bending spring. In particular for a meandering design of the bending spring, relatively high elasticity may be achieved in the plane of the meander. Ideally, the bending springs are linear, and in this case are characterized by a single spring constant. "Linearity" means that a constant force acting in the direction of the provided deflection direction always results in the same deflection of the spring, regardless of how strongly the spring has already been deflected. However, this is not the case for the bending springs in sensors of the prior art. Evaluation of the acting forces is therefore difficult and prone to errors.

Micromechanical sensors are known from U.S. Pat. No. 6,705,164 B2 and WO 01/20259 A1 in which sensor masses are attached to other movable masses by means of a bending spring device, or to a substrate by means of an anchoring. The bending spring device is composed of multiple individual bending springs which have meanders. Elastic movability between the two masses or between the mass and the substrate or anchoring is achieved as a result of the meanders. The meanders are each attached to the components of the sensor, which are movable relative to one another, via short stubs. The movability of the bending spring device essentially results from the meanders themselves, not from the stubs. A disadvantage of these bending spring devices of the prior art is that, for the same force, the bend of the bending spring device cannot be linearly deflected. This is particularly disadvantageous since, for example, for the same Coriolis force the path of deflection of the corresponding sensor mass becomes smaller with increasing deflection. This results in errors in detecting the associated acceleration or yaw rate values, or, in order to compensate for the errors, requires complicated computations which likewise adversely affect the accuracy and the speed of display of the acceleration or yaw rate.

A bending spring device is known from U.S. Pat. No. 6,954,301 B2 which extends in a meandering shape on both sides of short fastening stubs. Although linearity of the bending spring device may be improved in this manner, a controllable stiffness of the bending spring device is difficult to achieve. In addition, the spring is asymmetrical due to the S-shaped curve, which may result in parasitic effects which are difficult to control. Such a bending spring device is generally very soft, and it is difficult to introduce a predefined stiffness into this bending spring device.

The object of the present invention, therefore, is to provide a micromechanical sensor in which a bending spring device is present that allows a deflection of the bending spring device which is as linear as possible.

The object is achieved by a micromechanical sensor having the features of claim 1.

A micromechanical sensor according to the invention has a substrate and at least one mass which is situated on the substrate and which moves relative to the substrate for detecting linear and/or angular accelerations of the sensor. On the one hand, the mass moves in the sense of a drive motion form, which in the absence of external accelerations is stationary, and on the other hand responds with detection motions when acceleration forces and/or Coriolis forces act on the sensor. The moving sensor mass is attached to the substrate by means of at least one bending spring device. Alternatively, multiple masses which move toward one another may be connected by at least one bending spring and moved relative to one another. Consequently, it is not necessary in each case for the sensor mass to be situated directly on the substrate. In some embodiments of micromechanical sensors according to the invention, the sensor mass may also be attached to a drive mass, for example, and together with the drive mass moved as a primary motion, and moved relative to the drive mass only for indicating an acceleration force and/or Coriolis force. The sensor mass and the drive mass are then connected to one another via the corresponding bending spring device. The bending spring device is designed in the form of at least one meander.

According to the invention, the bending spring device has multiple, in particular two, spring bars extending essentially parallel to one another for improving the linear characteristic, i.e., the linear spring characteristic, of the bending spring device during the rotational motion, and at least one meander on at least one, preferably on all, of the spring bars.

The design provided according to the invention for the bending spring device by means of a multiple spring bar having at least two spring bars extending essentially in parallel allows a targeted, predeterminable flexural strength of the bending spring device. The additional provision of meanders on at least one, preferably on all, of the spring bars contributes very advantageously to the linearity of the bending characteristic of the bending spring device. The bending spring device according to the invention is therefore linearly and uniformly bendable, at least with regard to deflections in the plane in which the meanders are situated. According to the invention, not only double spring bars, but also multiple spring bars having more than two spring bars are possible, although the double spring bars described below are particularly advantageous. In addition, multiple meanders are possible. By combining the multiple spring bars, which take part in the bending of the bending spring device, with meanders associated therewith, a spring characteristic is obtained such that the linearity of the bending spring device is provided over the entire range of its deflections.

It is particularly advantageous when at least two of the spring bars, but preferably all of the provided spring bars, extend essentially parallel to one another. A particularly uniform provided stiffness of the bending spring device is thus achieved, the bending spring device being substantially linearly deflectable over a large bending range. In another embodiment of the invention, however, it may also be provided that individual spring bars or all of the spring bars extend not in parallel, but tapering toward one another, for example. A curved design of the spring bars may also be advantageous, in which case the parallelism of the spring bars no longer has to be provided. The most favorable embodiment of the invention should be selected in each case, depending on the application and the required stiffness of the bending spring device.

If the meander is designed in such a way that it merges into the spring bar in a rounded manner, stresses which are caused by bending may be achieved which are more uniform and which do not have unacceptable peaks, even in extreme bending situations.

Similarly as for the meander merging into the spring bar in a rounded manner in order to avoid stress peaks, it is advantageous when the spring bar(s) likewise merge(s) in a rounded manner into the adjacent component, in particular the sensor mass or the substrate or an anchoring for attachment to the substrate. Stress peaks are thus reduced not only in the region of the meander, but also in the remainder of the bending spring device. Of course, the rounded transition may also be provided without the rounding at the meander.

In one advantageous embodiment of the invention, another measure for reducing and evening out the stresses in the bending spring device under load may be achieved by the rounded transition having a nonuniform progression, i.e., a non-constant radius of curvature. The meanders as well as the spring bars are thus connected to the adjacent components in a particularly gentle manner with regard to their stresses. The uniformity of the relation between the applied force or applied torque and the resulting deflection, and the associated accuracy of the measurement by the sensor, are thus improved.

It is particularly advantageous when the rounded transition is elliptical. As a result, it is possible in particular to reduce peak stresses in the springs, which may be introduced into the sensor due to an externally acting shock event, and thus make damage to the sensor more unlikely.

In one particularly advantageous embodiment of the invention, it is provided that the meander and/or the spring bar merge(s) in a branched manner into the sensor mass, the substrate, and/or an anchoring for attachment to the substrate. Stress peaks in the transition points are thus additionally reduced. The linear deflection of the bending spring device is assisted in this manner.

When the meander and/or the spring bar has/have an elliptical bend or a convex or concave curvature, this supports a bending characteristic which reduces stress peaks even in extreme situations, such as mechanical shock events, for example. Damage to the sensor is thus largely avoided. The linear bending characteristic of the bending spring device improves the signal evaluation by the sensor.

The meander is advantageously situated off-center with respect to the spring bar, in particular, closer to moving components than to the stationary anchoring of the bending spring device. This results in different lengths of the spring bar on each respective side of the meander. The length of the particular spring bar section should be selected depending on the application and the desired flexural strength. However, it has been shown that, in particular for a stationary part and a moving part, or when a less intensely moved component is connected to a more intensely moved component, the meander should be situated closer to the more intensely moved component. The spring bar section present between the meander and the more intensely moved component should therefore be smaller than the section facing the less intensely moved component or the stationary component.

The distance between the bars of the meander is preferably less than the distance between the two spring bars. It has been shown that particularly high linearity of the bending spring device is achievable using such a design. In any case, it must be ensured that contact between the individual spring bars is avoided during severe bending of the bending spring device. Such contact would result in damage and intense interference with the linearity requirements of the bending spring device.

When the distance between the two spring bars is a multiple of the width of the spring bars, a bending spring device is advantageously provided which is very elastic and has individual bending bars, but still has relatively high overall strength. In addition, contact of the individual spring bars is avoided due to the large distance.

The length of the two spring bars is advantageously greater than the length of the bars of the meander. As a result, the important bending motion of the bending spring device is provided by the spring bars themselves. Only one compensating structure is provided by the meander in order to support the linearity of the bending spring device.

When the spring bars of the double spring bar and/or the bars of the meander have a symmetrical design, uniform bending of the bending spring device in both provided directions is ensured. On the other hand, one-sided bending may be provided by an asymmetrical design of the bending spring device.

To allow particularly harmonic and uniform bending without stress peaks on individual parts of the bending spring device, it is advantageous when the meander has a radius of curvature having an internal midpoint. The radius of curvature should be as large as possible in order to obtain a small curvature of the meander. Stress peaks in the region of the turns or inflections of the spring are thus reduced.

When the meander has at least one further radius of curvature having a midpoint outside the meander, so that the meander has a convex curvature, a particularly harmonic and uniform transition is provided which likewise contributes to the reduction of stress peaks.

SUMMARY OF THE INVENTION

Brief Description of the Drawings

Further advantages of the invention are described in the following exemplary embodiments.

DETAILED DESCRIPTION OF THE PREFERRED EMBODIMENTS

Figure 1:
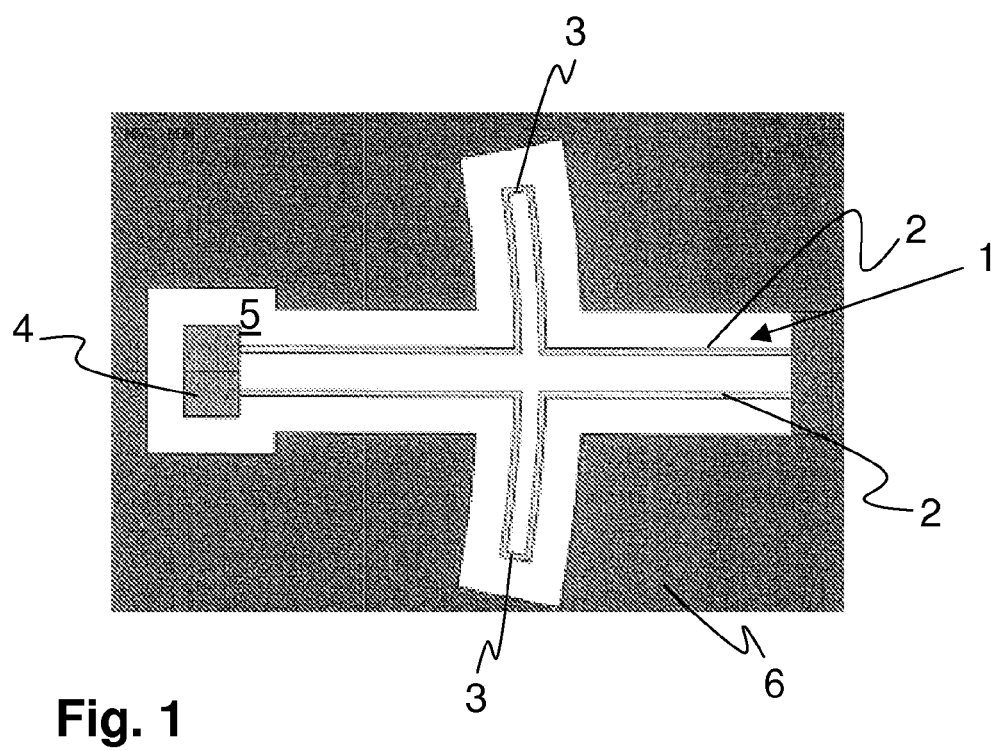
FIG. 1 show a bending spring device according to the invention, having a large meander.

FIG. 1 shows a bending spring device 1 according to the invention, having two spring bars 2 extending parallel to one another, a meander 3 being situated on each of the spring bars 2. The bending spring device 1 is attached at one end to an anchoring 4 on a substrate 5. The other end of the bending spring device 1 is situated on a mass 6 which is deflected or bent around the anchoring 4, parallel to the substrate 5. The bending occurs in particular as primary oscillation of the mass 6 about the anchoring 4. The bending thus allows a rotational motion in a plane, or, if a sensor mass is involved, a deflection due to a Coriolis force or acceleration force which occurs. The spring bars 2 and the meander 3 have a cross-sectional design, perpendicular to the plane of the drawing, such that they allow controlled bending of the spring bars 2 and of the meander 3 in the plane of the drawing. Depending on the requirements for the mass 6, movability out of the plane of the drawing is either essentially prevented by an appropriately stable design of the spring bars, or is permitted in a controlled manner by virtue of an appropriate design. The movability of the mass 6 within the plane of the drawing is important for the present invention.

To attain the greatest possible degree of linearity in the bending of the spring device 1 in order to achieve the object of the invention, the two spring bars 2 extending essentially parallel to one another and the two meanders 3 are provided. The bending spring device 1 is thus able to behave in a substantially linear manner for a deflection about the anchoring 4, up to a maximum predetermined deflection path. In the present case, this means that a torque, perpendicular to the plane of the drawing, which acts on the mass 6 always causes the same rotation-like angular deflection of the mass 6 within the plane of the drawing, regardless of how strongly the mass 6 is already deflected within the plane of the drawing. The spring characteristic curve (the angular deflection with respect to an acting torque) of the bending spring device 1 is thus essentially constant over this predetermined maximum bending path. The conclusion to be drawn concerning the acting torque and/or a corresponding acceleration or yaw rate, based on the distance traveled by the mass 6, is greatly simplified due to the linearity of the motion, and results in greatly improved measuring results.

In the design in FIG. 1, the meander 3 is slightly curved. The meander has a large longitudinal extension, having a length L3 away from its associated spring bar 2. The sections of the spring bars 2 between the anchoring 4 and the meander 3, and between the meander 3 and the mass 6, having lengths L1 and L2, respectively, are approximately equal. Therefore, the bending capability of the spring bars 2 in these sections is likewise very high.

Figure 2:
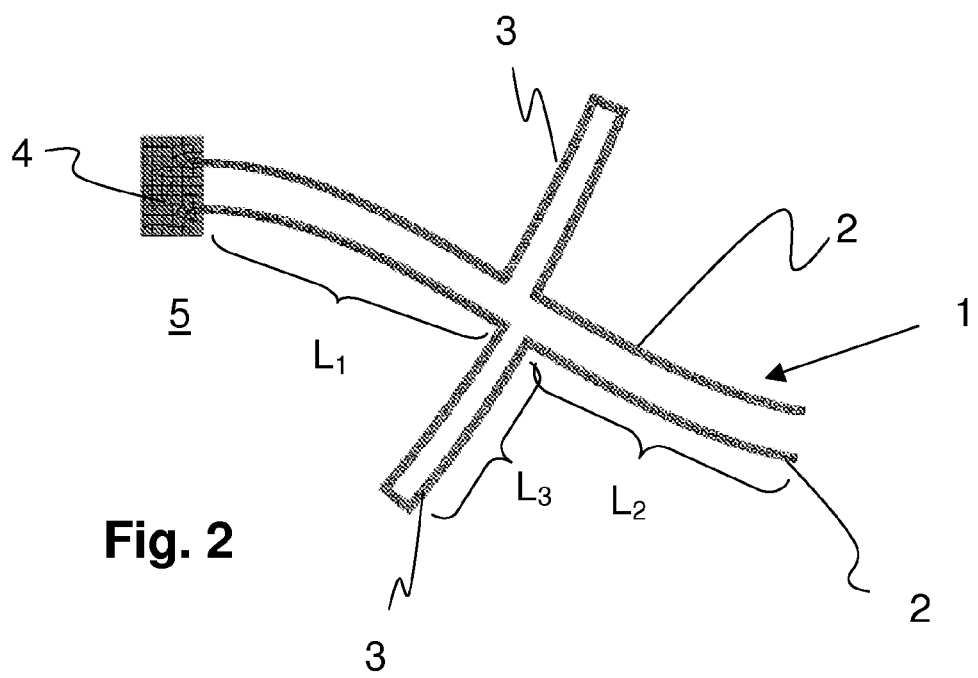
FIG. 2 shows a deflected bending spring device according to FIG. 1.

FIG. 2 shows a deflected bending spring device 1. It is apparent that the two spring bars 2 extending in parallel have different degrees of bending. The meanders 3 are shorter than in FIG. 1, and likewise have different degrees of bending. The meander 3 situated in the lower part of FIG. 2 is slightly compressed, while the upper meander 3 is slightly stretched. Overall, very good linearization of the deflection is thus achieved over the deflection range which is provided for the bending of the bending spring device 1.

Figure 3:
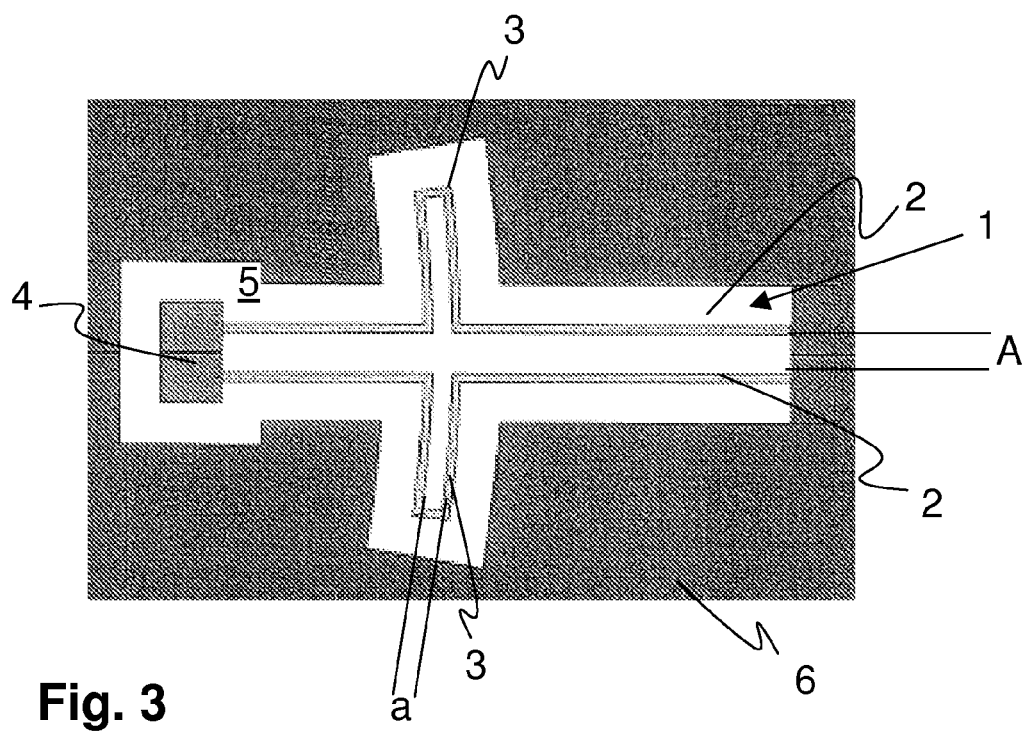
FIG. 3 shows a bending spring device according to the invention, having a small meander.

A modified design from FIG. 1 is illustrated in FIG. 3. Once again, the two spring bars 2 extend essentially parallel to one another. The meanders 3 situated on each spring bar 2 are shorter than in the design according to FIG. 1. In addition, the meanders are located closer to the anchoring 4, which is fixedly mounted on the substrate 5. Thus, the bending characteristic of the bending spring device 1 is different from that in FIGS. 1 and 2. Depending on the requirements in the individual case, the hardness of the bending spring device 1 and the linearity of the bending spring device 1 may be influenced by varying the configuration of the meanders 3 on the spring bar 2 and the length of the meander 3.

In the designs in both FIG. 1 and FIG. 3, the distance a between the arms of the meander 3 is less than the distance A between the spring bars 2. In selecting the distances a and A, it is particularly important that the arms of the meander 3 or the spring bars 2 do not contact one another during the maximum provided bending of the bending spring device 1, which could result in damage or erroneous measuring results.

Figure 4:
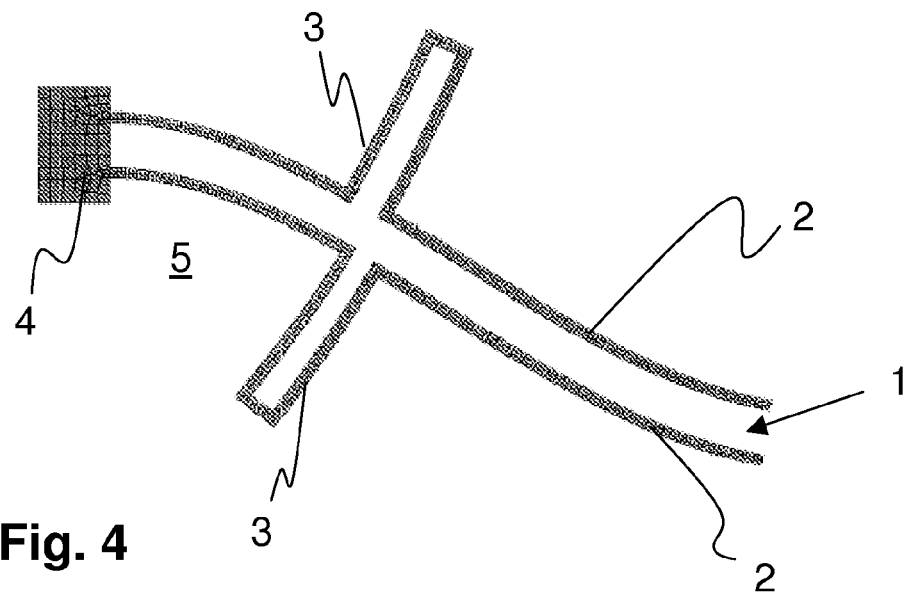
FIG. 4 shows a deflected bending spring device according to FIG. 3.

FIG. 4 illustrates the deflection of the bending spring device 1 from FIG. 3. Here as well, it is apparent that the meander 3 shown in the lower part of the figure is compressed, while the meander 3 shown at the top is slightly pulled apart. The bending line of the spring bars 2 is also very different from the bending line of the spring bars 2 in FIG. 2. The section of the spring bar 2 located between the anchoring 4 and the meander 3 is more strongly bent due to the meanders 3 being closer to the anchoring 4. In contrast, the section of the spring bar 2 between the meander 3 and the mass 6 is less strongly bent.

Figure 5:
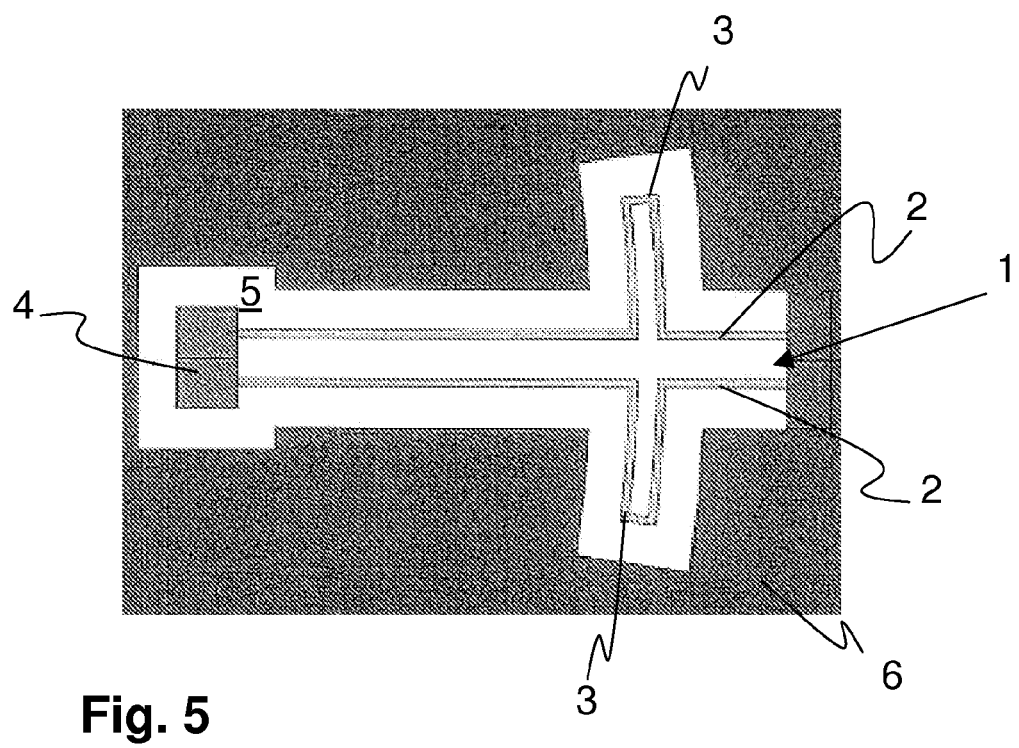
FIG. 5 shows a bending spring device having meanders in the vicinity of the moving part.

FIG. 5 shows another exemplary embodiment of the ending spring device 1. In this case the meanders 3 are located closer to the movable mass 6. The section of the spring bar 2 between the anchoring 4 and the meander 3 is clearly longer than the section between the meander 3 and the mass 6.

Figure 6:
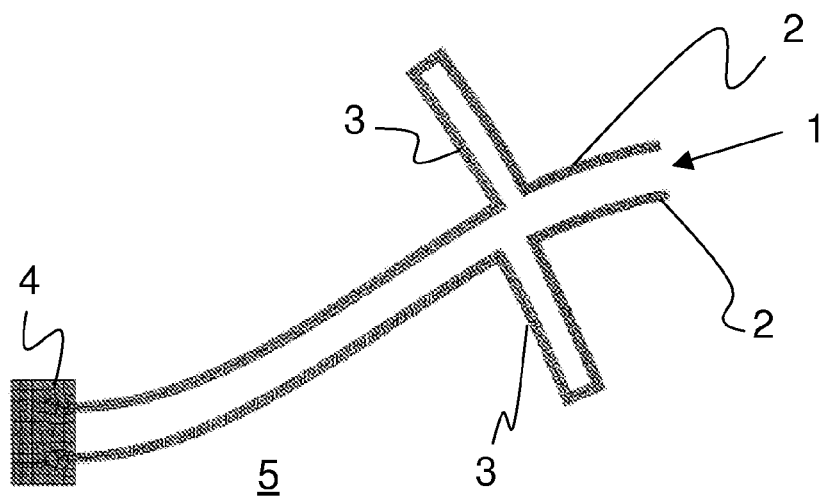
FIG. 6 shows a deflected bending spring device according to FIG. 5.

Upward bending is shown according to the illustration in FIG. 6. Once again, one of the meanders 3 is bent together, while the other meander 3 is pulled apart. The compressive stress on the meanders 3, the same as for the other exemplary embodiments, occurs on the meander 3 which is situated in the bending direction.

It is apparent from FIGS. 1 through 6 that the configuration of the meanders 3 on the spring bars 2 may result in different bending characteristics of the bending spring device 1. Depending on the requirements imposed on the bending spring device 1, the spring characteristic and linearity of the spring may be influenced by the configuration of the meanders 3. The bending spring device 1 thus has a design which is harder or less hard, or more linear or less linear. In each case, the objective is to obtain either a spring which is as linear as possible, or a spring having a precisely settable nonlinear characteristic within the maximum provided bending range.

Figure 7:
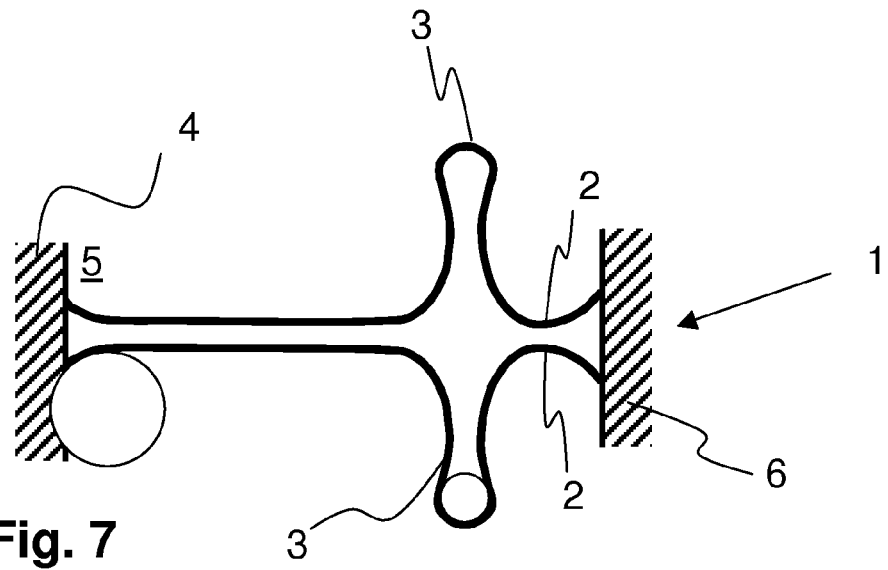
FIG. 7 shows a bending spring device having rounded transitions.

FIG. 7 illustrates a schematic diagram of another design of a bending spring device 1. The transitions of the spring bars 2 into the adjacent components such as the anchoring 4 and the mass 6, for example, are rounded. The meanders 3 also have roundings. The roundings are partly osculating curves of circles of curvature having a constant radius or a variable radius. The meanders 3 have indentations, by means of which a relatively large circle of curvature, and therefore a small curvature of the spring at the meander 3, is obtained at the inflection point. Stress peaks at the transitions and inside the individual spring sections are thus reduced. Damage to the bending spring device 1, even from shock effects, may thus be prevented. In addition, these rounded transitions also result in more uniform, and thus more linear, bending of the bending spring device 1.

Figure 8:
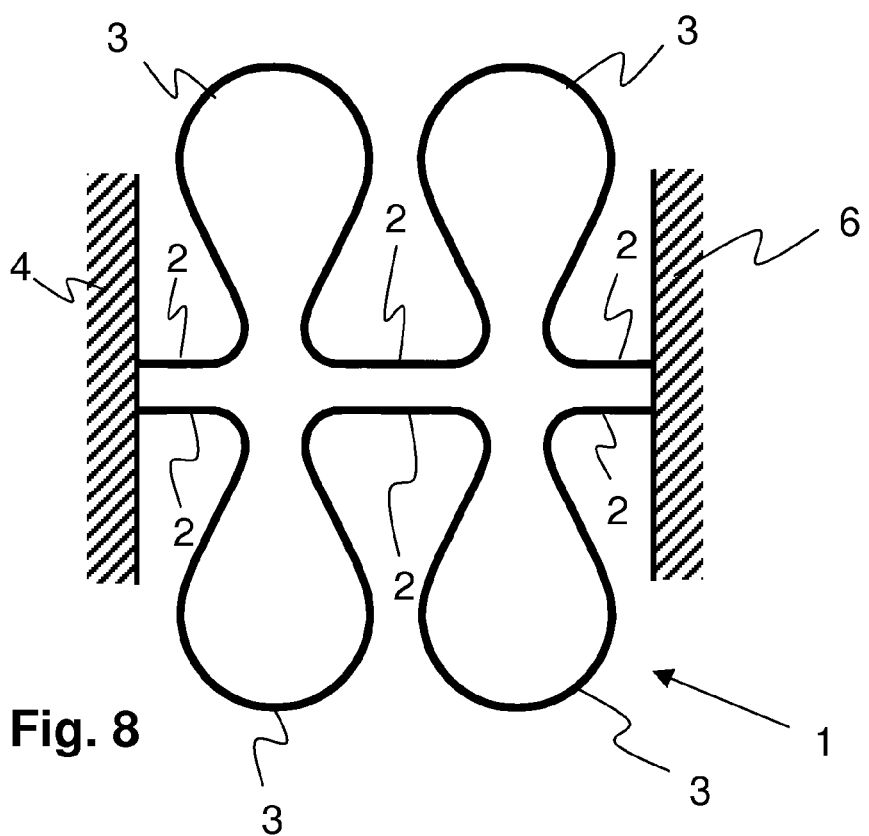
FIG. 8 shows a bending spring device having multiple meanders.

FIG. 8 illustrates another variant of the present invention. The bending spring device 1 once again has two spring bars 2 extending in parallel. Two meanders 3 are situated on each spring bar 2. The transitions from the spring bars 2 into the meanders 3 and at the inflection point in the meander 3 have a small curvature; i.e., relatively large circles of curvature are provided, to which the bending springs conform.

The present invention is not limited to the exemplary embodiments illustrated. Thus, for example, the two spring bars 2 may extend at a more or less slight taper toward one another. In other respects, embodiments of the invention are encompassed which fall under the wording of the applicable claims.

LIST OF REFERENCE NUMERALS/CHARACTERS

1 Bending spring device
2 Spring bar
3 Meander
4 Anchoring
5 Substrate
6 Mass
a Distance between meanders
A Distance between spring bars
L Length

What is claimed is:

1. A micromechanical sensor, comprising:
a substrate;
an anchor coupled to the substrate;
a bending spring device responsive to a rotational movement about the anchor, the bending spring device comprising spring bars that extend substantially parallel from the anchor to one or more masses, wherein each spring bar comprises:
a first end being coupled to the anchor; and
a second end being coupled to the one or more masses; and
a meander located between the first and the second end, wherein a total length of at least one spring bar is greater than a length of bars of the meander so as to improve a linear spring characteristic of the bending spring device.

2. The micromechanical sensor according to claim 1, wherein the meander merges into at least one of the spring bars in a rounded manner.

3. The micromechanical sensor according to claim 1, wherein one of the spring bars merges in a rounded manner into at least one of the masses, the substrate, and the anchor for attachment to the substrate.

4. The micromechanical sensor according to claim 3, wherein a rounded transition associated with the rounded manner has a non-constant radius of curvature.

5. The micromechanical sensor according to claim 3, wherein a rounded transition associated with the rounded manner is elliptical.

6. The micromechanical sensor according to claim 1, wherein one of the spring bars merges in a branched manner into at least one of the masses, the substrate, and the anchor for attachment to the substrate.

7. The micromechanical sensor according to claim 1, wherein at least one of the meander and the spring bars has an elliptical bend.

8. The micromechanical sensor according to claim 1, wherein the meander is placed off-center with respect to the at least one of the spring bars, and is closer to moving components than to a stationary anchoring of the at least one bending spring.

9. The micromechanical sensor according to claim 1, wherein a distance between bars of the meander is less than a distance between two spring bars.

10. The micromechanical sensor according to claim 1, wherein a distance between two of the spring bars is a multiple of a width of the spring bars.

11. The micromechanical sensor according to claim 1, wherein the bending spring device is deflected about the anchoring point in a substantially linear deflection path in response to a torque acting on the one or more masses, the bending spring device having a substantially constant spring characteristic curve.

12. The micromechanical sensor according to claim 1, wherein both a double spring bar included in the spring bars and the meander have a symmetrical design.

13. The micromechanical sensor according to claim 1, wherein the meander has a radius of curvature associated with an internal center of curvature inside the meander.

14. The micromechanical sensor according to claim 1, wherein the meander has at least one further radius of curvature associated with a center of curvature outside the meander.

15. The micromechanical sensor according to claim 1, wherein the bending spring device is coupled to both a sensor mass and a drive mass.

16. The micromechanical sensor according to claim 1, wherein the meander is located off-center with respect to the spring bar.

17. The micromechanical sensor according to claim 1, wherein the spring bars are substantially parallel to each other.

18. The micromechanical sensor according to claim 1, wherein the spring bars are tapered toward each other.

19. The micromechanical sensor according to claim 1, wherein the bars of the meander have a different length than bars of another meander.

20. The micromechanical sensor according to claim 1, wherein the bending spring device inhibits an out-of-plane motion.

* * * * *